United States Patent
Kruglick

(10) Patent No.: US 8,371,128 B2
(45) Date of Patent: Feb. 12, 2013

(54) THERMAL MANAGEMENT WITH ELECTROCALORIC EFFECT LAYER

(75) Inventor: Ezekiel Kruglick, Poway, CA (US)

(73) Assignee: Empire Technology Development, LLC, Wilmington, DE (US)

( * ) Notice: Subject to any disclaimer, the term of this patent is extended or adjusted under 35 U.S.C. 154(b) by 559 days.

(21) Appl. No.: 12/620,477

(22) Filed: Nov. 17, 2009

(65) Prior Publication Data

US 2011/0113791 A1    May 19, 2011

(51) Int. Cl.
    *F25B 21/00*    (2006.01)
(52) U.S. Cl. .............................. 62/3.1; 62/335
(58) Field of Classification Search ........... 62/3.1, 62/3.2, 335, 333; 165/104.26, 96; 700/275
    See application file for complete search history.

(56) References Cited

U.S. PATENT DOCUMENTS

| | | | | |
|---|---|---|---|---|
| 3,638,440 | A * | 2/1972 | Lawless | 62/3.1 |
| 4,757,688 | A * | 7/1988 | Basiulis et al. | 62/3.2 |
| 6,595,004 | B1 * | 7/2003 | Ghoshal | 62/3.1 |
| 6,877,325 | B1 * | 4/2005 | Lawless | 62/3.1 |
| 7,382,512 | B2 * | 6/2008 | Chen et al. | 359/279 |
| 7,495,400 | B2 * | 2/2009 | Testin | 318/268 |
| 2007/0089492 | A1 * | 4/2007 | Chen et al. | 73/54.12 |
| 2007/0208235 | A1 * | 9/2007 | Besson et al. | 600/301 |
| 2007/0212906 | A1 * | 9/2007 | Clayton et al. | 439/77 |
| 2007/0212919 | A1 * | 9/2007 | Clayton et al. | 439/326 |
| 2007/0212920 | A1 * | 9/2007 | Clayton et al. | 439/326 |

OTHER PUBLICATIONS

Chen, S.W., "On the Performance of Flat-Plate Closed-Loop Pulsating Heat Pipes," 1997, pp. 123 (submitted as two .pdf's due to file size).
Guan, C.K., "Experimental Investigation of Heat Transfer of Flat Heat Pipe," 1993, pp. 2.
Wu, M.C., "Thermal Optimal Design for Heat Sinks Integrated with Thermoelectric Coolers," 1995, pp. 4.
Cotter, T. P., "Principles and Prospects for Micro Heat Pipes," 5th International Heat Pipe Conference, May 1984, 9 pages.
Neese et al., "Large Electrocaloric Effect in Ferroelectric Polymers Near Room Temperature," Science, Aug. 8, 2008, vol. 321, pp. 821-823.
Ashley, S., "Cool Polymers: Toward the Microwave Oven Version of the Refrigerator," Scientific American, Oct. 30, 2008, 2 pages.

* cited by examiner

*Primary Examiner* — Mohammad Ali
(74) *Attorney, Agent, or Firm* — Steven S. Rubin; Moritt Hock & Hamroff LLP

(57) ABSTRACT

Techniques described herein are generally related to a thermal management with an electrocaloric effect layer. Example embodiments include systems, articles, methods and apparatus, as well as other embodiments that are described and claimed.

20 Claims, 10 Drawing Sheets

Varying an electrical field applied to ECE layer
704

Propelling fluid within heat pipe
708

THERMAL MANAGEMENT WITH ELECTROCALORIC EFFECT LAYER

BACKGROUND

Heat pipes may be used to manage thermal conditions within computing systems. A heat pipe may include an evaporator portion in which a fluid absorbs thermal energy from an electronic component. The fluid may work to deliver the absorbed thermal energy to a condenser portion of the heat pipe where the thermal energy may then be subsequently released. The fluid may then return to the evaporator portion.

BRIEF DESCRIPTION OF THE DRAWINGS

Subject matter is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
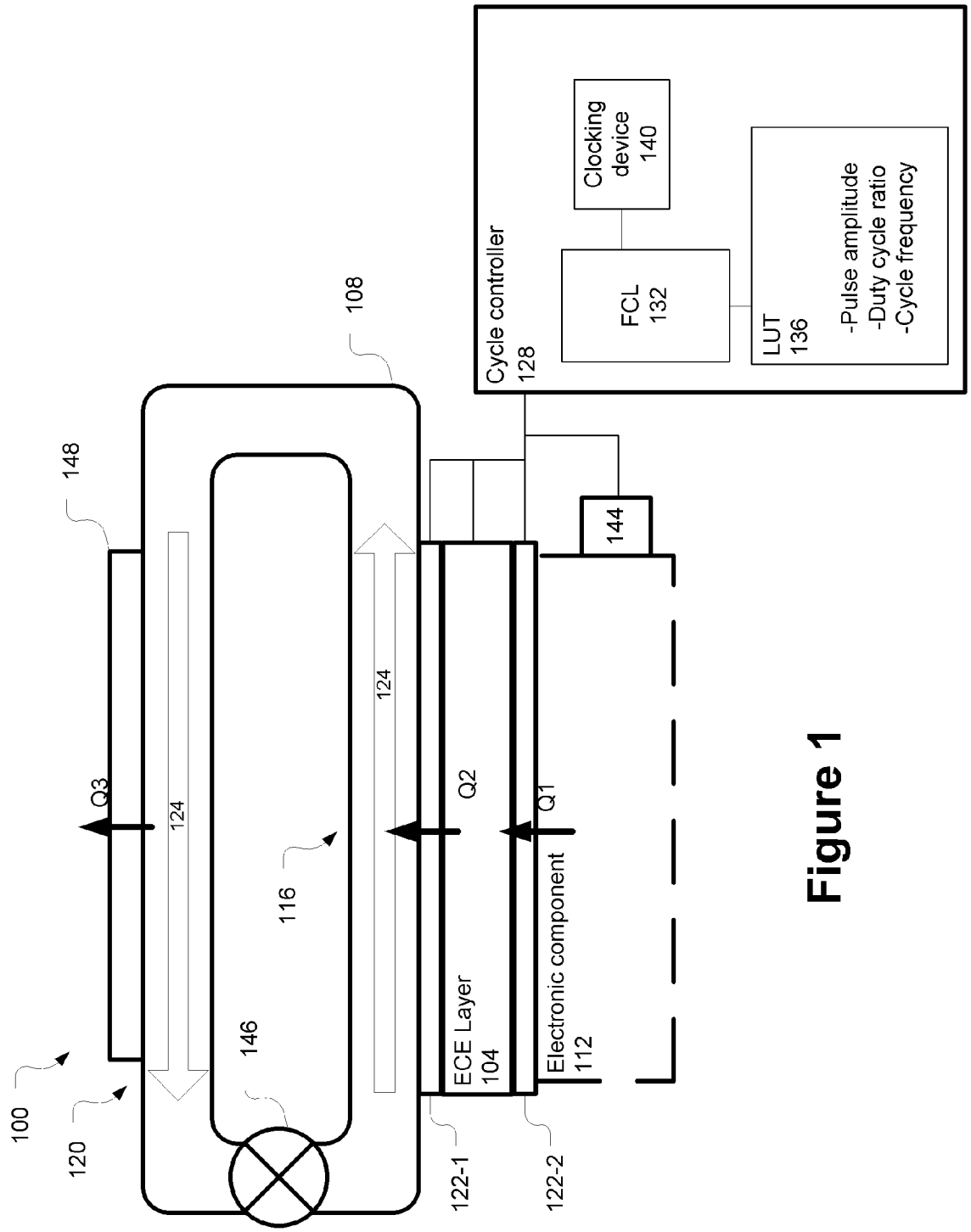
FIG. 1 is a block diagram of a thermal management system.

The following description sets forth various examples along with specific details to provide a thorough understanding of claimed subject matter. It will be understood by those skilled in the art that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

This disclosure is drawn to, inter alia, methods, apparatus, articles, and systems related to a thermal management system with an electrocaloric effect (ECE) layer. In various embodiments, techniques will be described where the ECE layer may be controlled in a manner to increase heat transfer capabilities and efficiencies of the thermal management system. Control and operation of the ECE layer, as well as electrical, physical, and thermal couplings of the ECE layer with various components, will be illustrated and described.

FIG. 1 is a block diagram of a thermal management system 100 arranged in accordance with at least some embodiments described herein. The thermal management system 100 may include an ECE layer 104 and a heat pipe 108. The ECE layer 104 may be thermally coupled to the heat pipe 108 and a thermal source, e.g., electronic component 112. Two components may be thermally coupled to one another when thermal energy from one of the thermally-coupled components may be transferred to the other thermally-coupled component. Thermally-coupled components may be adjacent components or non-adjacent components. The electronic component 112 is shown as a dotted line to indicate that it may, in some examples, be considered separate from the thermal management system 100. Thermal energy transfer from the electronic component 112 to the ECE layer 104 may be referred to as Q1, while thermal energy transfer from the ECE layer 104 to the heat pipe 108 may be referred to as Q2.

The heat pipe 108 may include an evaporator portion 116 and a condenser portion 120. A fluid 124 disposed within the heat pipe 108 may be configured to absorb thermal energy from the electronic component 112, through the ECE layer 104, in the evaporator portion 116. The fluid 124 may then be adapted to transfer the absorbed thermal energy from the evaporator portion 116 to the condenser portion 120, which may dispose of the thermal energy by, e.g., transferring the thermal energy into ambient surroundings through evaporating fins or plates of heat sink structure 148. This transfer of thermal energy from the condenser portion 120 to the ambient surroundings may be referred to as Q3.

The ECE layer 104 may constitute an ECE material that exhibits a reversible change in temperature under an electrical field applied by, e.g., a field generating device 122, shown in FIG. 1 with a first electrode 122-1 and a second electrode 122-2 being positioned on opposing sides of the ECE layer 104 (in other embodiments, the electrodes may be disposed on other opposing sides). Each of the electrodes of the field generating device 122 may include a plate of conducting material, e.g., gold, that may be less than one micrometer thick. This may provide desirable thermal coupling of components physically coupled to the electrodes of the field generating device 122. Application of an electrical field to an ECE material, which may also be referred to as "activating" the ECE material, may result in a change in conformation of an atomic structure that alters a number and character of energy modes available. This may result in rapid changes in temperature of the ECE material. In some embodiments, the ECE layer 104 may be constituted with a ferroelectric poly (vinylidene fluoride-trifluoroethylene) (P(VDF-TrFE)) copolymer. In other embodiments, the ECE layer 104 may be constituted of other polar polymers, e.g., P(VDF-TrFEcholorfluoroethylene (CFE)), lead zirconate titanate (PZT), or other materials capable of being controlled to exhibit rapid and reversible temperature changes in a similar manner.

Adjacent components of the thermal management system 100 may be physically coupled with one another by an adhesive or other fastening structures, e.g., pins, clips, screws, clamps, etc. In some embodiments, a thermal interface material may be disposed between two physically-coupled components to facilitate a thermal coupling. A thermal interface material may be a paste, pad, or grease that may include, e.g., aluminum oxide, zinc oxide, boron nitride, etc.

Embodiments of the present disclosure describe affecting a thermal attribute of the ECE layer 104 to facilitate absorption of thermal energy by the fluid 124 disposed within the heat pipe 108 at the evaporator portion 116. The thermal attribute of the ECE layer 104 may be affected by varying the electrical field that may be applied to the ECE layer 104 by the field generating device 122, which may result in rapid increase or decrease of a temperature of the ECE layer 104. A cycle controller 128 may be electrically coupled to the field generating device 122 to control the variable application of the electrical field to the ECE layer 104 to affect the thermal attribute of the ECE layer 104.

In various embodiments, the electronic component 112 may be any type of electronic component that resides in an electronic device that sources heat when operating. In some embodiments, the electronic component 112 may be a processor or controller device such as a microprocessor (μP), a microcontroller (μC), a digital signal processor (DSP), a memory controller, or a graphics controller, etc. In some other embodiments the electronic component 112 may be a storage component, or a memory component, etc.

The cycle controller 128 may include field control logic (FCL) 132 that is configured to control the timing and/or intensity of the voltage provided to the field generating device 122 according to an activation cycle. In some embodiments, the field control logic 132 may be coupled with a cycle parameter lookup table (LUT) 136 and a clocking device 140. The field control logic 132 may select cycle parameter values from the LUT 136 that define the activation cycle. The cycle parameters may include, but are not limited to, duty cycle ratio, cycle frequency, and pulse amplitude. In some embodiments, the duty cycle ratio may be less than fifty percent of the duty cycle, and may be approximately twenty percent of the duty cycle in a particular embodiment. The cycle frequency of a particular embodiment may be approximately one kilohertz. The desired values for the various cycle parameters may be dependent on objectives and implementation details of a particular embodiment. In some embodiments, the desired cycle parameters may relate to the amount of time that it takes to transfer a desired amount of thermal energy from the electronic component 112 to the ECE layer 104 and/or the amount of time that it takes to transfer a desired amount of thermal energy from the ECE layer 104 to the heat pipe 108. These amounts may relate to a thermal mass of the heat pipe 108, a thermal mass of the ECE layer 104, a thermal coefficient of the ECE layer 104, relative temperatures of the adjacent components, thermal resistances between the adjacent components, etc.

In some embodiments, the activation cycle may be constant throughout operation of the thermal management system 100. In other embodiments, the field control logic 132 may receive input variables over time and select cycle parameter values from the LUT 136 based on the received input variables. In this manner, the activation cycle may be updated to reflect changing conditions. In some embodiments, the field control logic 132 may be coupled to the electronic component 112 to receive operational state data as an input variable. Operational state data may include information related to a current or upcoming operational state of the electronic component 112. Operational state may relate to the processing activity of the electronic component 112, e.g., the number of active threads or processes, number of processors or processing cores that are active, etc. In some embodiments, the field control logic 136 may be coupled with one or more temperature sensors 144 to receive one or more temperatures as input variables. While the one or more temperature sensors 144 are shown in FIG. 1 as being coupled to the electronic component 112, other embodiments may include temperature sensors coupled to additional/alternative components, e.g., the ECE layer 104 and/or the heat pipe 108.

In some embodiments, the activation cycle may be updated based on the occurrence or non-occurrence of an event. For example, when a defined input variable, e.g., temperature of the electronic component 112, reaches a certain threshold, the field control logic 136 may select, from the LUT 136, another value for a given cycle parameter, e.g., duty cycle ratio.

In various embodiments, the cycle controller 128 may include hardware, firmware, and/or software components that are configured to operate to provide the control capabilities described in conjunction with disclosed embodiments. As will be understood, software components of the cycle controller 128 may include instructions stored in a computer readable medium, that, when executed by a processor result in a machine performing the described operations. In some embodiments, part or all of the cycle controller 128 may be embodied in the electronic component 112.

Figure 2:
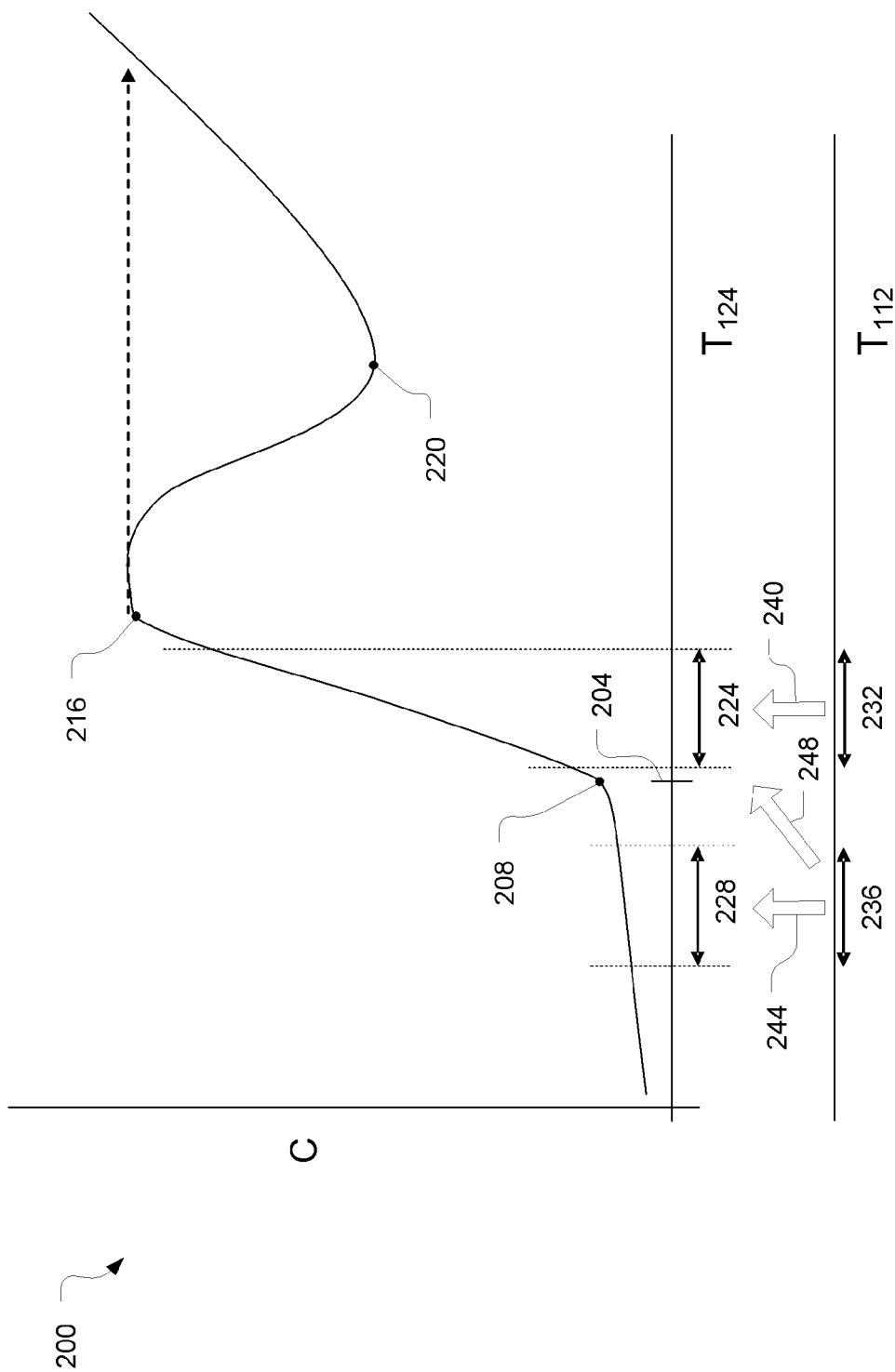
FIG. 2 is a graph that depicts heat absorbing capacity of a fluid within a heat pipe of the thermal management system.

FIG. 2 is a graph that depicts heat absorbing capacity of a fluid within a heat pipe of a thermal management system, according to at least some embodiments of the present disclosure. Graph 200 depicts heat absorbing capacity C of the fluid 124 as a function of a temperature $T_{124}$ of the fluid 124. When the temperature $T_{124}$ is below a first temperature 204, the fluid 124 may be in a liquid phase that provides the fluid 124 with a limited heat absorbing capacity C. At point 208, the fluid 124 may begin nucleate boiling with the heat absorbing capacity C significantly increasing up to point 216. After point 216, the fluid 124 may experience transitional boiling and its heat absorbing capacity C may decrease until point 220. After point 220, the fluid may experience film boiling and its heat absorbing capacity C may again increase with temperature $T_{124}$. Thus, the heat absorbing capacity C of the fluid 124 may have a non-linear response curve as a function of the temperature $T_{124}$ with the first significant increase of heat absorbing capacity C occurring generally in a temperature range 224.

Were the heat pipe 108 to be physically and thermally coupled directly with the electronic component 112, a temperature $T_{112}$ of the electronic component 112 within a range 232 may result in the temperature $T_{124}$ being within the range 224; and a temperature $T_{112}$ within a range 236 may result in the temperature $T_{124}$ being within the range 228. These corresponding temperature ranges are represented by arrows 240 and 244, respectively. Therefore, this type of thermal management system would need to keep the temperature of the electronic component 112 in the temperature range 232 in order to activate the higher heat absorbing capacities of the fluid 124. This may result in an effective lower boundary to the operating temperature of the electronic component 112 for devices that employ such thermal management systems. Embodiments of the present disclosure, describe how the thermal attribute of the ECE layer 104, which may be interposed between the electronic component 112 and the heat pipe 108, may be affected so that the temperature of the electronic component 112 may be kept in the range 236 while still achieving the higher heat absorbing capacities that occur in range 224, as represented by arrow 248.

Figure 3:
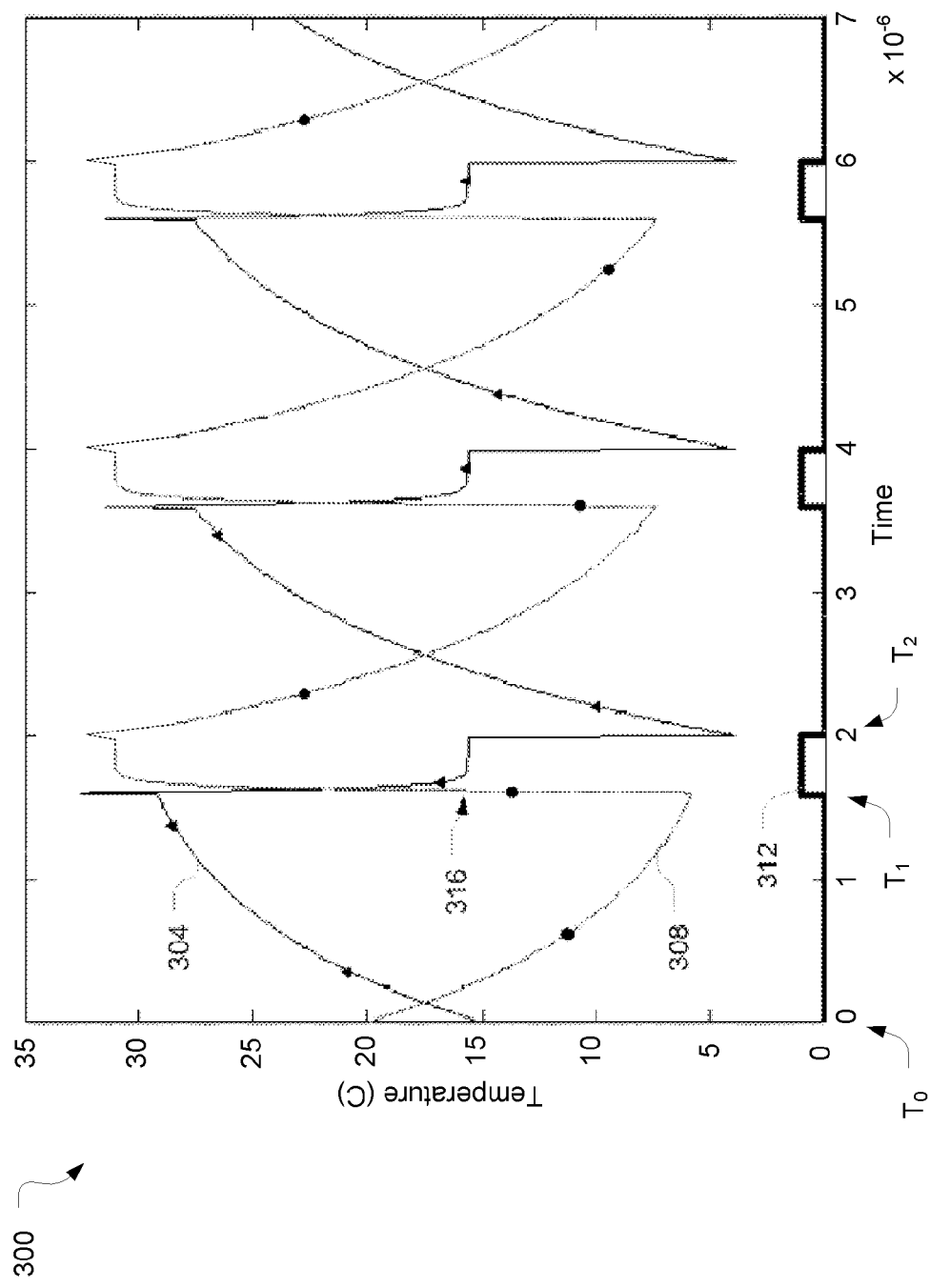
FIG. 3 is a graph illustrating concepts of an operating cycle of the thermal management system.

FIG. 3 is a graph illustrating operational concepts of a thermal management system in accordance with at least some embodiments described herein. In graph 300, line 304 may represent temperature $T_{ECE}$, line 308 may represent Q1, and line 312 may represent an activation cycle. From time $T_0$, e.g., at the beginning of a particular activation cycle, the temperature $T_{ECE}$ may begin to increase due to the ECE layer 104 absorbing thermal energy from the electronic component 112. Over a corresponding time period Q1 may gradually decrease due to a decreasing temperature differential between the ECE layer 104 and the electronic component 112. At time $T_1$ a voltage may be provided to the field generating device 122 resulting in an electrical field being applied across the ECE layer 104, which in turn, results in a sudden increase in the temperature $T_{ECE}$ to a high temperature of between thirty and thirty-five degrees Celsius (C) above an ambient temperature in some embodiments. This may cause nucleate boiling of the fluid 124 that translates to a spike in the thermal flux and a decrease in the temperature $T_{ECE}$. At point 316, the decrease of the temperature $T_{ECE}$ may level off due to the heat pipe 108 no longer pulling much thermal energy from the ECE layer 104. At time $T_2$ the voltage may be removed from the field generating device 122 resulting in the sudden decrease of the temperature $T_{ECE}$ to a low temperature of less than ten degrees C. above an ambient temperature in some embodiments. The sudden decrease of temperature $T_{ECE}$ at time $T_2$ may result in a spike in Q1 due to an increase in the temperature differential between the ECE layer 104 and the electronic component 112. The activation cycle may then be repeated.

In some embodiments, the high temperature of the temperature $T_{ECE}$, immediately following time $T_1$, may be greater than a temperature of the electronic component 112 and a low temperature of the temp $T_{ECE}$, immediately following time $T_2$, may be less than the temperature of the electronic component 112.

In such a manner, the ECE layer 104 may gradually absorb thermal energy from the electronic component 112 during a first phase of the activation cycle, which may also be referred to as a deactivation phase. During a second phase of the activation cycle, or activation phase, the electrical field may be applied across the ECE layer 104 and the high heat absorbing capabilities of the fluid 124 may be activated.

The cycle parameter values defining the activation cycle depicted by line 312 may be constant, at least for the time period shown. In other embodiments, one or more of the values of the cycle parameters may be varied.

Figure 4:
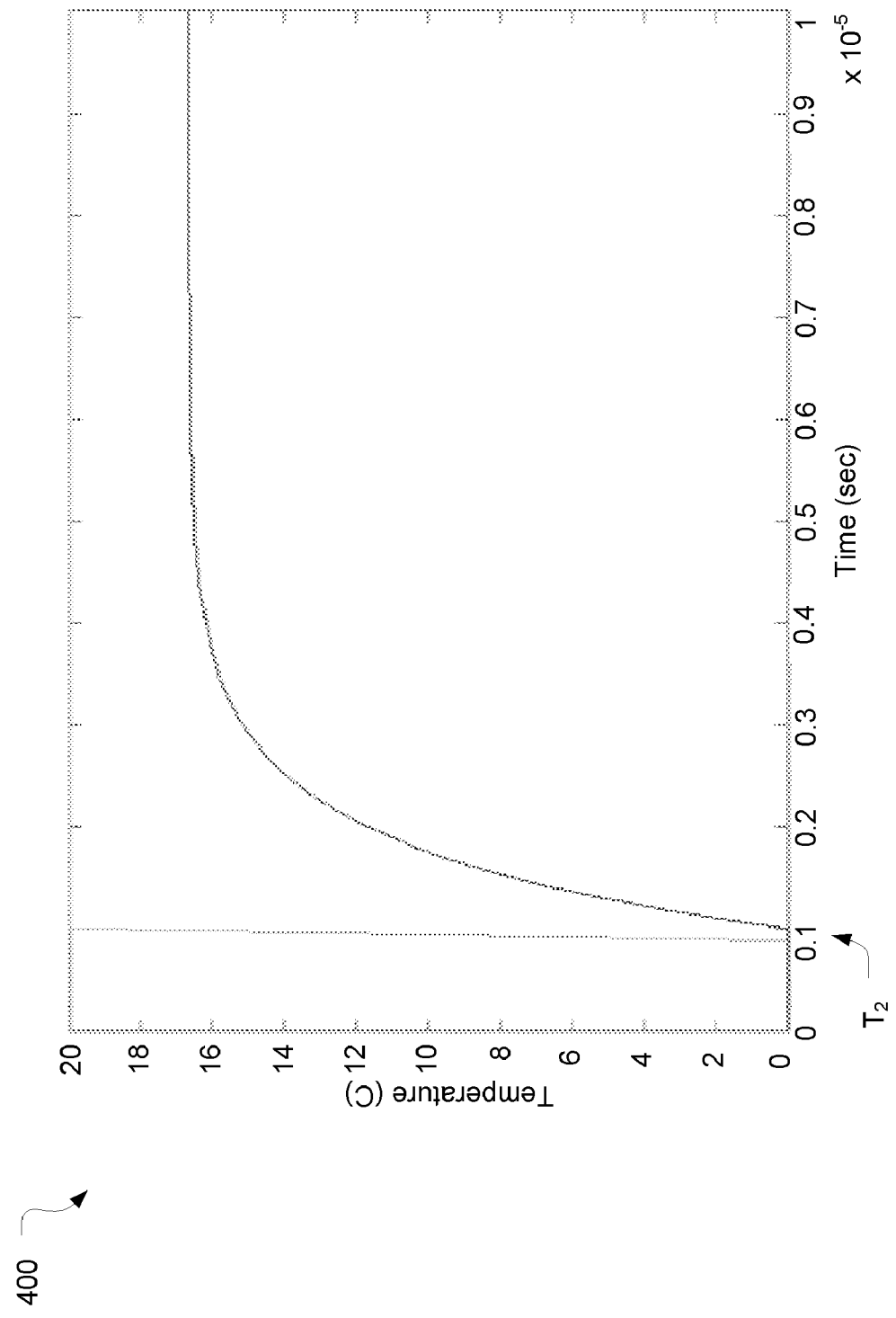
FIG. 4 is a graph describing a temperature of an electrocaloric effect (ECE) layer over the course of a second phase of an operating cycle.
Figure 5:
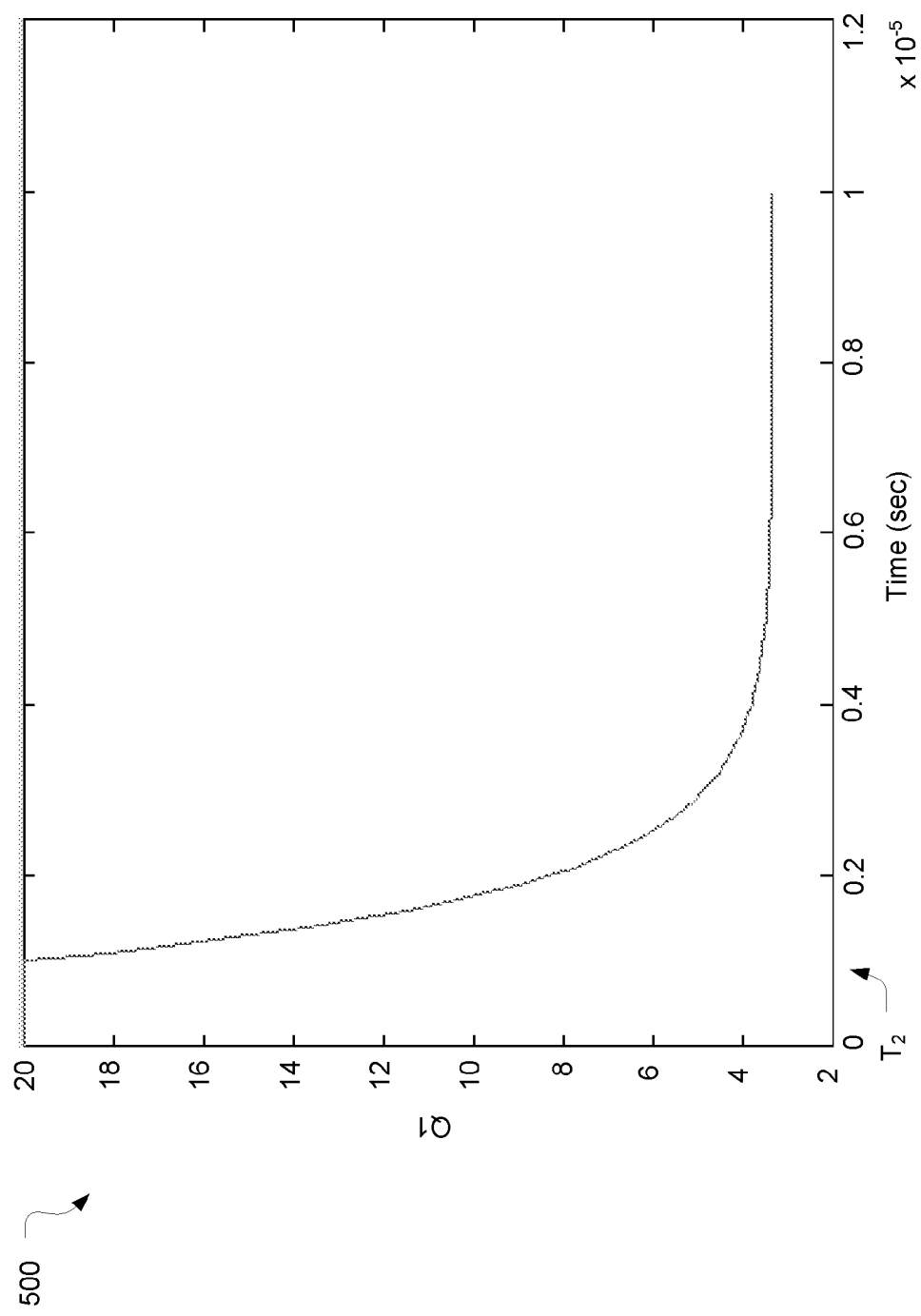
FIG. 5 is a graph describing a thermal transfer from an electronic component to the ECE layer over the course of a second phase of an operating cycle.
Figure 6:
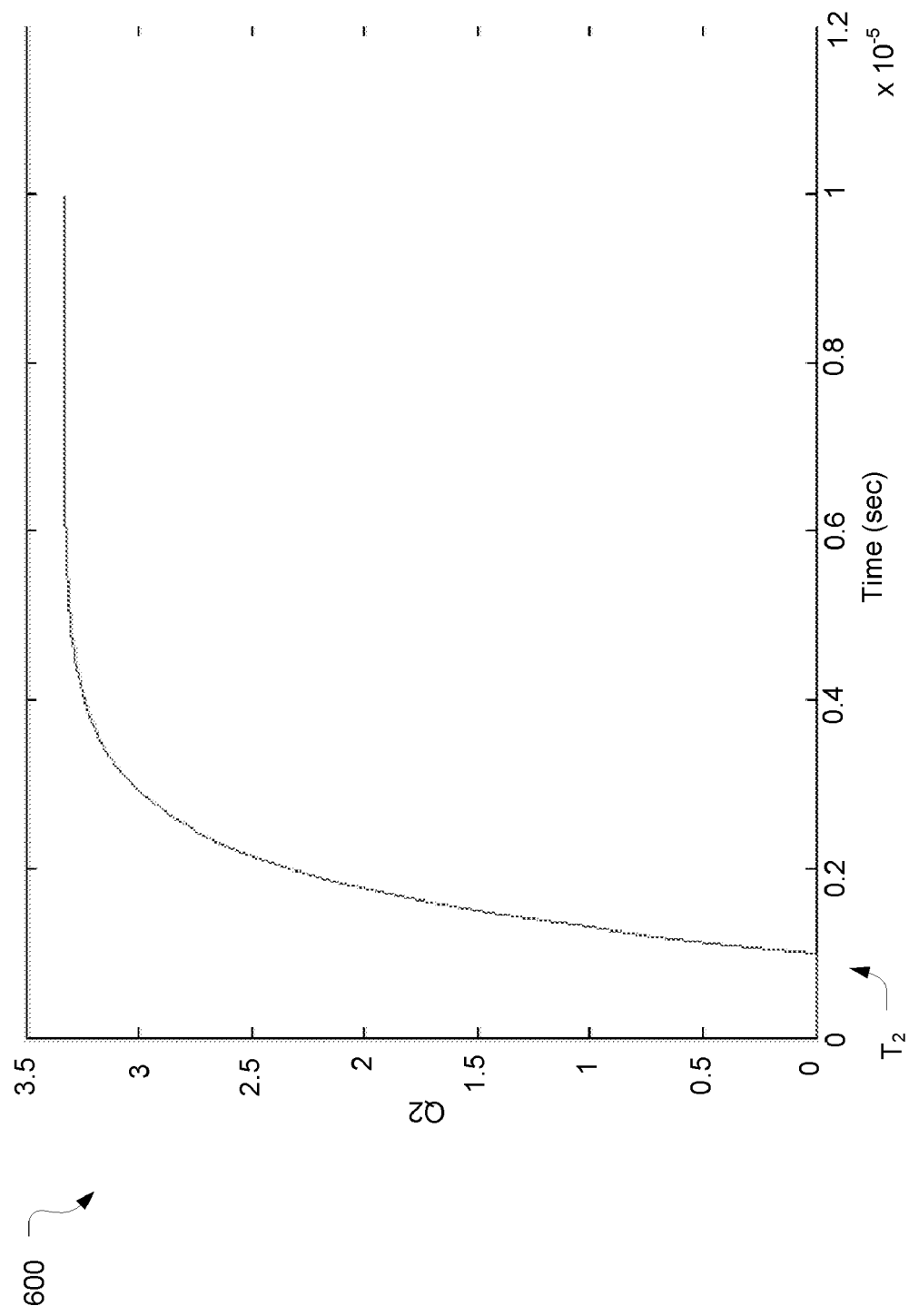
FIG. 6 is a graph describing a thermal transfer from the ECE layer to the heat pipe over the course of a second phase of an operating cycle.

Referring now to FIGS. 4-6. FIG. 4 is a graph 400 describing a temperature of an ECE layer over the course of a deactivation phase of an activation cycle, in accordance with at least some embodiments of the present disclosure. FIG. 5 is a graph 500 describing a thermal transfer from an electronic component to an ECE layer over the course of a deactivation phase of an activation cycle, in accordance with at least some embodiments of the present disclosure. FIG. 6 is a graph 600 describing a thermal transfer from an ECE layer to a heat pipe over the course of a deactivation phase of an activation cycle, in accordance with at least some embodiments of the present disclosure.

Graphs 400, 500, and 600 may respectively describe $T_{ECE}$, Q1, and Q2 over the course of a deactivation phase of an activation cycle that has immediately followed an activation phase of the activation cycle of the thermal management system 100. As described above, the activation phase may activate the high-heat transfer capabilities of the fluid 124 resulting in $T_{ECE}$ dropping a certain degree, after which, the ECE layer 104 may be deactivated at time $T_2$ resulting in $T_{ECE}$ dropping to a temperature that is below a temperature of the electronic component 112. During the deactivation phase following time $T_2$, $T_{ECE}$ may gradually increase approximately sixteen degrees over the course of $0.6 \times 10^{-5}$ seconds due to the ECE layer 104 absorbing thermal energy from the electronic component 112. As can be seen in graph 500, sometime after $T_2$, the thermal transfer from the electronic component 112 to the ECE layer 104, i.e., Q1, may decrease as a result of $T_{ECE}$ approaching a temperature of the electronic component 112. Graph 600 shows that the thermal transfer from the ECE layer 104 to the heat pipe 108, i.e., Q2, may gradually increase over the same period. However, it may be noted that Q2 still remains low compared to Q1 until the next activation phase of the activation cycle activates the high heat transfer capabilities of the fluid 124.

Figure 7:
FIG. 7 is a flow diagram of operations within an operating cycle of the thermal management system.

FIG. 7 is a flow diagram of operations of a thermal management system, in accordance with at least some embodiments of the present disclosure. Flow diagram 700 illustrates one or more operations, functions, or actions as illustrated by one or more of blocks 704 and/or 708. Processing may start at block 704.

At block 704 ("varying an electrical field applied to ECE layer"), the operations may include varying an electrical field applied to the ECE layer 104 to increase and/or decrease the temperature $T_{ECE}$. Varying the electrical field applied to the ECE layer 104 may be done by providing a voltage to, and/or removing a voltage from, the field generating device 122. In at least some embodiments, the varying will include providing the voltage to, and removing the voltage from, the field generating device 122 to cyclically vary the electrical field in a manner that results in a corresponding cyclical increase and decrease of the temperature $T_{ECE}$. Varying the electrical field applied to the ECE layer 104 may facilitate a transference of thermal energy from the electronic component 112 to the evaporator portion 116 and, in particular, to the fluid 124 disposed within the evaporator portion 116 of heat pipe 108. Transference of the thermal energy from the electronic component 112 to the evaporator portion 116 of heat pipe 108 may take place through the ECE layer 104 as described above. Block 704 may be followed by block 708.

The facilitation of the transference of the thermal energy from the electronic component 112 to the evaporator portion 116 may be due to the cyclical variance of temperature $T_{ECE}$ causing nucleate boiling of the fluid 124 to a greater degree than would otherwise be caused by the operating temperature of the electrical component 112 alone. As described above, during a first phase, with a voltage removed from the field generating device 122, the relative temperature of the ECE layer 104 compared to the electronic component 112 may be such that thermal energy may be transferred from the electronic component 112 to the ECE layer 104. During a second phase, a voltage may be provided to the field generating device 122 to apply an electrical field to the ECE layer 104, resulting in the temperature $T_{ECE}$ increasing to an extent that results in nucleate boiling of the fluid 124 within the evaporator portion 116 adjacent to the ECE layer 104. With the fluid 124 in a nucleate boiling range, the heat pipe 108 may pull significant amounts of thermal energy from the ECE layer 104, including thermal energy absorbed by the ECE layer 104 from the electronic component 112 during the first phase.

At block 708 ("propelling fluid within heat pipe"), the operating cycle may include propelling fluid within the heat pipe 108 to facilitate a transference of thermal energy from the evaporator portion 116 to the condenser portion 120. The fluid 124 may be propelled through the heat pipe 108 in the direction generally indicated by the arrows of the fluid 124 in FIG. 1. The propulsive force may be provided by a pump 146, shown in FIG. 1. In other embodiments, propulsive force may be additionally/alternatively provided by capillary action, thermal forces, etc. The fluid 124 within the condenser portion 120 may dispose of thermal energy absorbed in the evaporator portion 116 by dissipating the thermal energy through, e.g., evaporating fins or plates on the heat sink structure 148. The cooled fluid 124 may then return to the evaporator portion 116.

Although flow diagram 700 is illustrated as a series of sequential operations, the operations described in one or more of the blocks 704 and/or 708 may take place contemporaneously with one another or in any other order. Moreover, methods within the scope of this disclosure may include more or fewer operations than that illustrated in FIG. 7.

Figure 8:
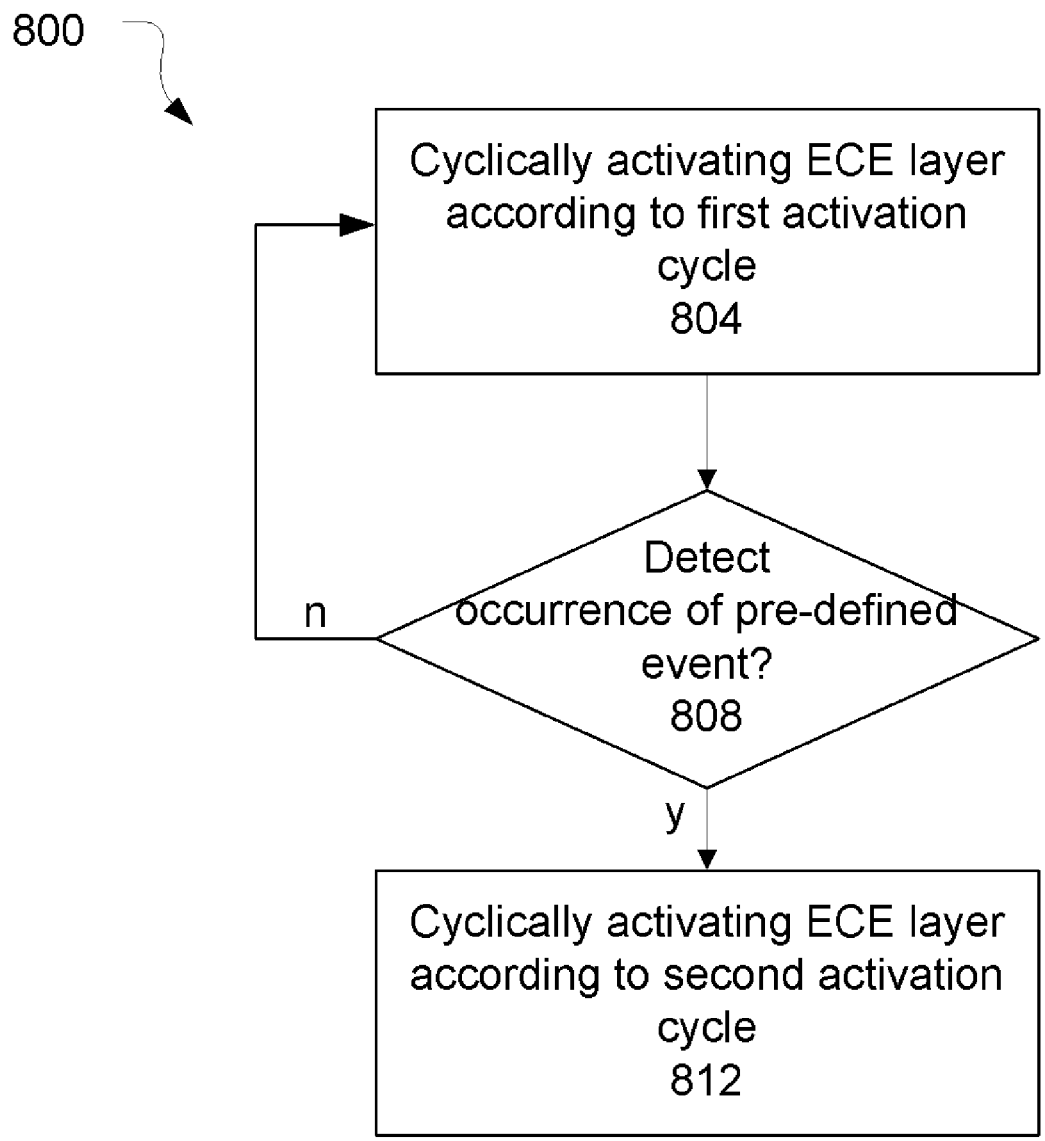
FIG. 8 is a flow diagram of control operations of a cycle controller.

FIG. 8 is a flow diagram of control operations of a cycle controller, in accordance with at least some embodiments of the present disclosure. Flow diagram 800 may include various operations, functions or actions as illustrated by one or more of blocks 804, 808, and/or 812.

Processing may begin at block 804.

At block 804 ("cyclically activating ECE layer according to a first activation cycle"), the control operations, in some embodiments, may include cyclically activating the ECE according to a first activation cycle. The first activation cycle may have a set of cycle parameters that include, but are not limited to, pulse amplitude, duty cycle ratio, and cycle frequency. Block 804 may be followed by block 808.

At block 808 ("detect occurrence of pre-defined event"), the control operations, in some embodiments, may include the field control logic 136 determining whether an occurrence of a pre-defined event has occurred based on received input variables. In some embodiments, this pre-defined event may be the change of operating state of the electronic component 112. This may be determined, for example, by the field control logic 136 receiving an indication from the electronic component 112 that additional processing cores are to be activated from a dormant status. In some embodiments, the pre-defined event may be a temperature of the electronic component 112 reaching a predetermined threshold temperature. This may be determined, for example, by the field control logic 136 receiving a temperature signal from a temperature sensor 144 associated with the electronic component 112. The field control logic 136 may then determine whether the temperature of the electronic component 112 is greater than the predetermined threshold temperature. If so, the field control logic 136 may determine that the occurrence of the pre-defined event has been detected.

If an occurrence of the pre-defined event is detected, block 808 may be followed by block 804 and the ECE layer 104 may continue to be activated according to the first activation cycle. If an occurrence of the pre-defined event is detected, block 808 may be followed by block 812.

At block 812 ("cyclically activating ECE layer according to a second activation cycle"), the control operations, in some embodiments, may include cyclically activating the ECE layer 104 according to a second activation cycle based on the detecting of block 808. In some embodiments, the pre-defined event may be associated with a particular set of cycle parameters in the LUT 136, with at least one cycle parameter being different than a corresponding cycle parameter of the first activation cycle. Thus, upon detection of the pre-defined event in block 808, the field control logic 136 may access the LUT 136 to determine the set of cycle parameters associated with the pre-defined event and activate the ECE layer 104 according to the second activation cycle with its associated set of cycle parameters.

While one pre-defined event and two activation cycles are discussed in this embodiment, other embodiments may have any number of pre-defined events and activation cycles.

In such a manner, the performance of the thermal management system 100 may be dynamically tuned to provide appropriate heat transfer capabilities in divergent operating scenarios.

Although flow diagram 800 is illustrated as a series of sequential operations, the operations described in one or more of the blocks 804, 808, and/or 812 may take place contemporaneously with one another or in any other order. Moreover, methods within the scope of this disclosure may include more or fewer operations than that illustrated in FIG. 8.

Figure 9:
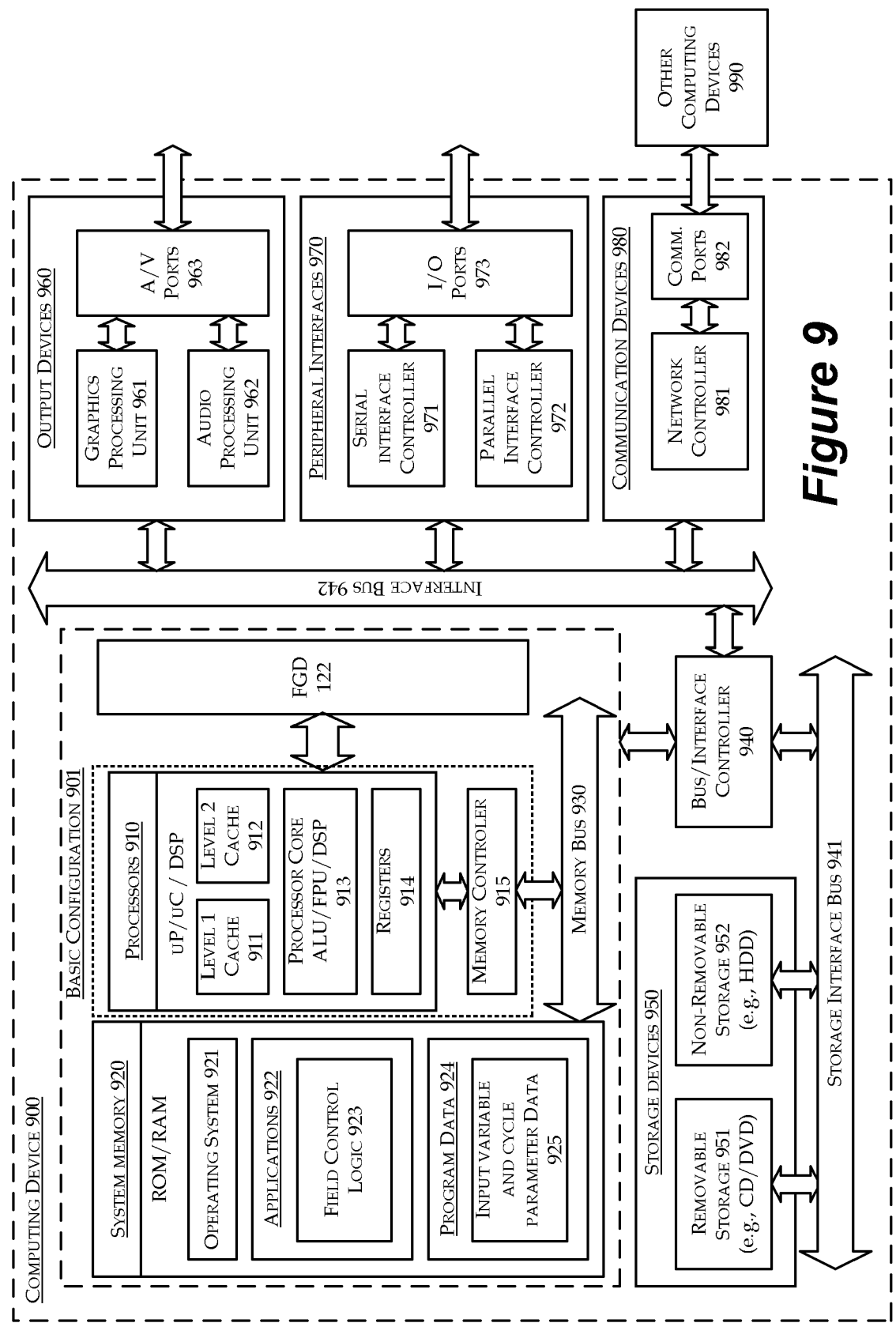
FIG. 9 is a block diagram of an example computing device that may be adapted to operate as a cyclic controller in a thermal management system.

FIG. 9 is a block diagram of an example computing device that may be adapted to operate as a cyclic controller in a thermal management system (TMS) arranged in accordance with at least some embodiments of the present disclosure. In a very basic configuration 901, computing device 900 may include one or more processors 910 and system memory 920. A memory bus 930 may be used for communicating between the processors 910 and the system memory 920.

Depending on the desired configuration, processors 910 may be of any type including but not limited to a microprocessor (µP), microcontroller (µC), digital signal processor (DSP), or any combination thereof. Processors 910 may include one more levels of caching, such as a level one cache 911 and a level two cache 912, a processor core 913, and registers 914. An example processor core 913 may include an arithmetic logic unit (ALU), a floating point unit (FPU), a digital signal processing core (DSP Core), or any combination thereof. An example memory controller 915 may also be used with the processors 910, or in some implementations the memory controller 915 may be an internal part of the processors 910.

Depending on the desired configuration, the system memory 920 may be of any type including but not limited to volatile memory (such as RAM), non-volatile memory (such as ROM, flash memory, etc.) or any combination thereof. System memory 920 may include an operating system 921, one or more applications 922, and program data 924. Applications 922 may include field control logic 132 that provides programming instructions configured to implement the above-described cycle control operations. Program Data 924 may include the applicable variable and related values associated with practicing the cycle control operations including, but not limited to, input variable and cycle parameter data 925 that provides input variables, e.g., information on an operational state and/or temperature of an electronic component thermally coupled to the thermal management system 100 and cycle parameters of the LUT 136. The cycle parameters of the LUT 136 may additionally/alternatively be stored in one or more data storage devices 950. The processors 910 may be coupled to the field generating device 122 to allow the field control logic 923 to control the variable provision of voltage to the field generating device 122 as described herein.

Computing device 900 may have additional features or functionality, and additional interfaces to facilitate communications between the basic configuration 901 and any required devices and interfaces. For example, a bus/interface controller 940 may be used to facilitate communications between the basic configuration 901 and the data storage devices 950 via a storage interface bus 941. The data storage devices 950 may be removable storage devices 951, non-removable storage devices 952, or a combination thereof.

Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and non-volatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of computing device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more NV ports 963. Example peripheral interfaces 970 include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which may be arranged to facilitate communications with one or more other computing devices 990 over a network communication link via one or more communication ports 982.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application-specific device, or a hybrid device that includes any of the above functions. Computing device 900 may also be implemented as a server, a personal computer including both laptop computer and non-laptop computer configuration, or any other device that would benefit from heat transfer capabilities described herein.

Figure 10:
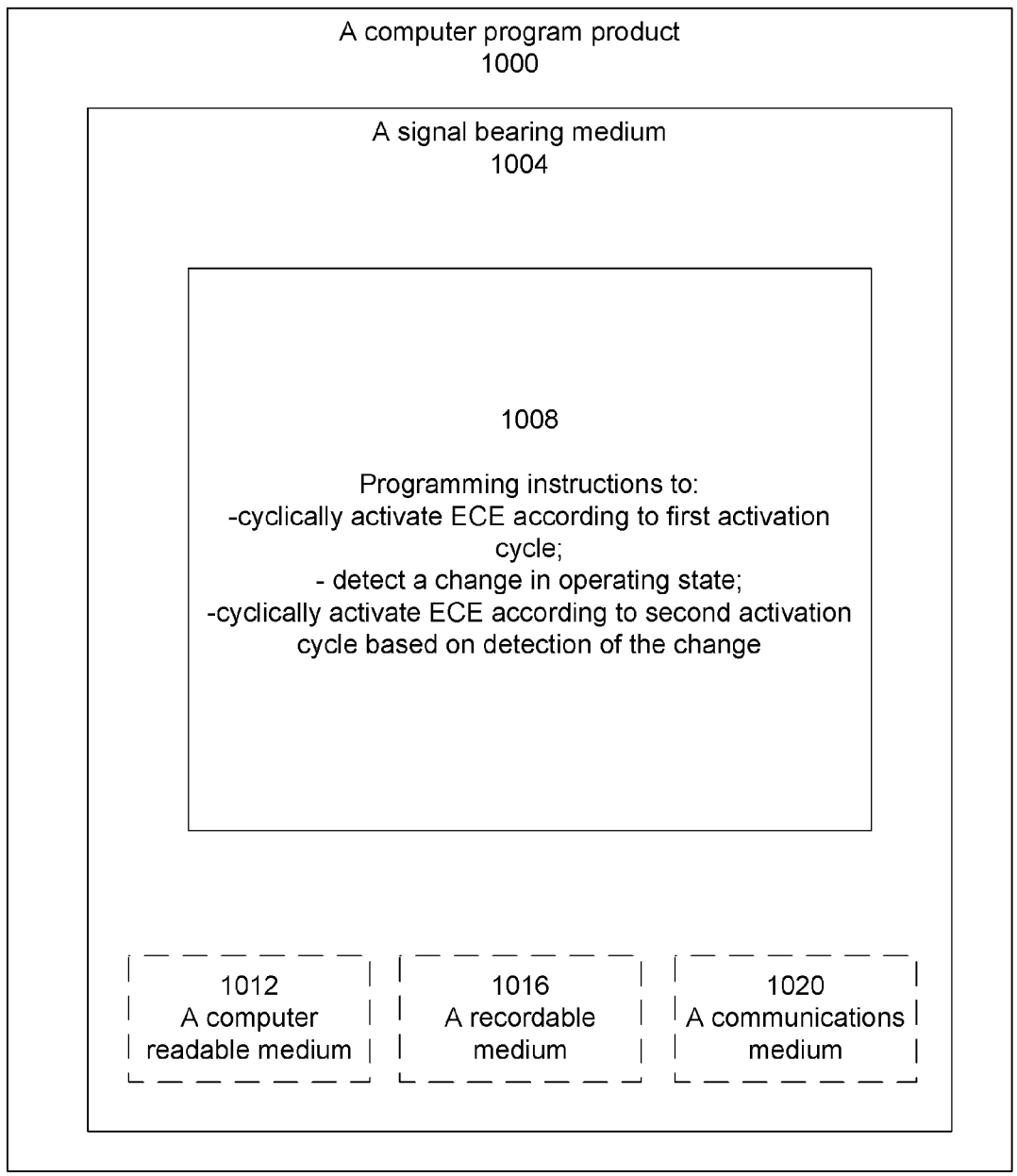
FIG. 10 is a block diagram of an example computer program product, all in accordance with at least some embodiments of the present disclosure.
Figure 9:
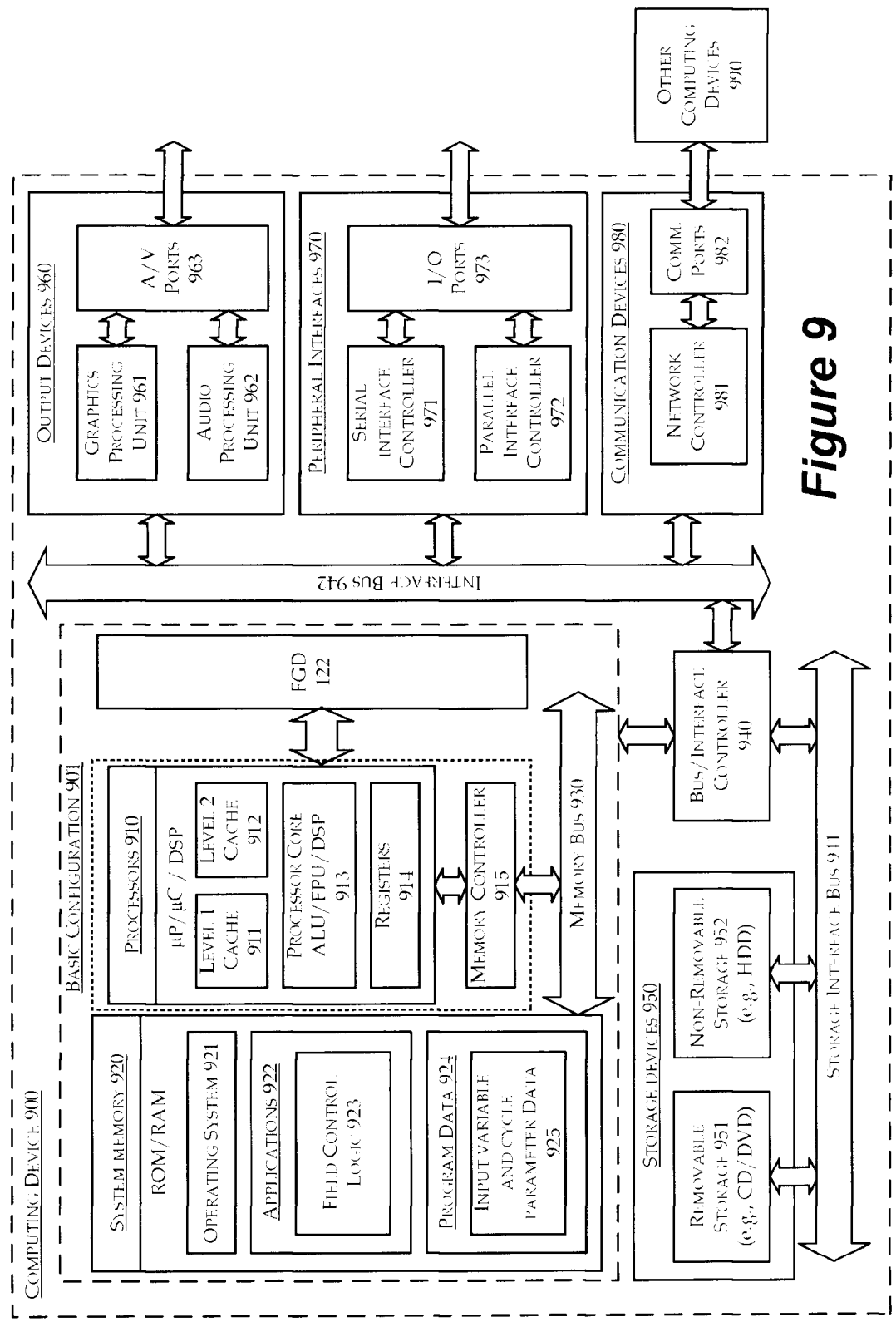

FIG. 10 illustrates a block diagram of an example computer program product, arranged in accordance with at least some embodiments of the present disclosure. In some examples, as shown in FIG. 10, computer program product 1000 may include a signal bearing medium 1004 that may also include programming instructions 1008. Programming instructions 1008 may be for cyclically activating the ECE layer 104 according to a first activation cycle. Programming instructions 1008 may also be for detecting an occurrence of a pre-defined event, and cyclically activating the ECE layer 104 according to a second activation cycle based at least in part on the detection of the occurrence.

Also depicted in FIG. 10, in some examples, computer program product 1000 may include one or more of a computer readable medium 1012, a recordable medium 1016, and a communications medium 1020. The dotted boxes around these elements depict different types of mediums included within, but not limited to, signal bearing medium 1004. These types of mediums may distribute programming instructions 1008 to be executed by logic. Computer readable medium 1012 and recordable medium 1016 may include, but are not limited to, a flexible disk, a hard disk drive (HDD), a Compact Disc (CD), a Digital Video Disk (DVD), a digital tape, a computer memory, etc. Communications medium 1020 may include, but is not limited to, a digital and/or an analog communication medium (e.g., a fiber-optic cable, a waveguide, a wired communication link, a wireless communication link, etc.).

Embodiments described in the present disclosure teach oscillating a temperature of the ECE layer 104 to take advantage of the non-linear response curve of the heat-absorbing capacities of the fluid 124. This may result in the ability to maintain a temperature of the electronic component 112 in a temperature range traditionally associated with low heat transfer performance, while still achieving the high heat transfer performance from the fluid 124. Embodiments of the thermal management system 100 have been demonstrated to transfer close to six times more heat than a conventional thermal management system for a given temperature of the electronic component 112. The efficient heat management provided by the thermal management system 100 may enable an increase in performance of the electronic component 112 and/or a reduction in the size, weight, and cost of the heat pipe 108.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the disclosure. Those with skill in the art will readily appreciate that embodiments of the disclosure may be implemented in a very wide variety of ways. This disclosure is intended to cover any adaptations or variations of the embodiments discussed herein. Therefore, it is manifestly intended that embodiments of the disclosure be limited only by the claims and the equivalents thereof.

What is claimed is:

1. A method for managing thermal energy from an electronic component, the method comprising:
    varying an electrical field applied to an electrocaloric effect layer to increase a temperature of the electrocaloric effect layer until a fluid in a first portion of a heat pipe in thermal communication with the electrocaloric effect layer begins nucleate boiling, wherein the electrocaloric effect layer is in thermal communication with the electronic component;
    thereafter, varying the electrical field applied to the electrocaloric effective layer to decrease the temperature of the electrocaloric effect layer after the fluid begins film boiling; and
    propelling the fluid disposed within the heat pipe from the first portion of the heat pipe to a second portion of the heat pipe.

2. The method of claim 1, wherein varying the electrical field to increase or decrease the temperature of the electrocaloric layer includes providing a voltage to a field generating device with a duty cycle ratio of less than fifty percent.

3. The method of claim 2, wherein providing the voltage includes providing the voltage to the field generating device with a duty cycle ratio that is approximately twenty percent of a duty cycle.

4. The method of claim 1, wherein varying the electrical field to increase or decrease the temperature of the electrocaloric layer includes providing a voltage to a field generating device with a cycle frequency of approximately one kilohertz.

5. The method of claim 1, wherein
    varying the electrical field to increase the temperature of the electrocaloric effect layer includes varying the electrical field until the electrocaloric effective layer reaches a first temperature that is greater than a temperature of the electronic component; and
    varying the electrical field to decrease the temperature of the electrocaloric effect layer includes varying the electrical field until the electrocaloric effective layer reaches a second temperature that is lower than a temperature of the electronic component.

6. The method of claim 5, wherein:
    the first temperature is in a range of approximately thirty and thirty-five degrees Celsius above an ambient temperature; and
    the second temperature is less than approximately ten degrees Celsius above the ambient temperature.

7. The method of claim 1, wherein varying the electrical field to increase or decrease a temperature of the electrocaloric effect layer includes varying the electrical field based at least in part on an operating state or temperature of the electronic component.

8. The method of claim 1, wherein varying the electrical field to increase or decrease a temperature of the electrocaloric effect layer includes varying the electrical field based at least in part on detecting the occurrence an event.

9. The method of claim 8, wherein detecting the occurrence of the event comprises determining that a temperature of the electronic component exceeds a threshold temperature.

10. The method of claim 1, further comprising:
    varying the electrical field to increase and decrease the temperature of the electrocaloric effect layer in accordance with a first duty cycle;
    detecting the occurrence of an event; and
    varying the electrical field to increase and decrease the temperature of the electrocaloric effect layer in accordance with a second duty cycle that is different from the first duty cycle.

11. An apparatus for managing thermal energy from a thermal source, the apparatus comprising:
    a heat pipe having a first portion configured to absorb thermal energy from the thermal source, a second portion configured to dispose of the thermal energy, and a fluid configured to transfer the thermal energy from the first portion to the second portion; and
    a cycle controller configured to vary an electrical field applied to an electrocaloric effect layer thermally coupled with the first portion of the heat pipe and the thermal source, the cycle controller effective to vary the electrical field to increase a temperature of the electrocaloric effect layer until the fluid begins nucleate boiling, and thereafter vary the electrical field applied to the electrocaloric effect layer to decrease the temperature of the electrocaloric effect layer when the fluid begins film boiling.

12. The apparatus of claim 11, wherein the electrocaloric effect layer includes a ferroelectric poly(vinylidene fluoride-trifluoroethylene) copolymer.

13. The apparatus of claim 11, wherein:
the thermal source is an electronic component that sources thermal energy when in operation; and
the electrocaloric effect layer is configured to be thermally coupled to the electronic component.

14. The apparatus of claim 11, wherein the cycle controller is further configured to:
vary the electrical field to increase the temperature of the electrocaloric effect layer until the electrocaloric effective layer reaches a first temperature that is greater than a temperature of the electronic component; and
vary the electrical field to decrease the temperature of the electrocaloric effect layer until the electrocaloric effective layer reaches a second temperature that is lower than a temperature of the electronic component.

15. The apparatus of claim 14, wherein:
the first temperature is in a range of approximately thirty and thirty-five degrees Celsius above an ambient temperature; and
the second temperature is less than approximately ten degrees Celsius above the ambient temperature.

16. The apparatus of claim 11, wherein the cycle controller is effective to vary the electrical field to increase or decrease a temperature of the electrocaloric effect layer based at least in part on an operating state or temperature of the electronic component.

17. The apparatus of claim 11, wherein the cycle controller is effective to vary the electrical field to increase or decrease a temperature of the electrocaloric effect layer based at least in part on detecting the occurrence an event.

18. The apparatus of claim 11, wherein the event comprises a determination that a temperature of the electronic component exceeds a threshold temperature.

19. A thermal management system comprising:
an electronic element
a heat pipe having a first portion configured to absorb thermal energy from the electronic component, a second portion configured to dispose of thermal energy, and a fluid configured to transfer thermal energy from the first portion to the second portion; and
a cycle controller configured to vary an electrical field applied to an electrocaloric effect layer thermally coupled with the first portion of the heat pipe and the thermal source, the cycle controller effective to vary the electrical field to increase a temperature of the electrocaloric effect layer until the fluid begins nucleate boiling, and thereafter vary the electrical field applied to the electrocaloric effect layer to decrease the temperature of the electrocaloric effect layer when the fluid begins film boiling.

20. The apparatus of claim 19, wherein the electrocaloric effect layer includes a ferroelectric poly(vinylidene fluoride-trifluoroethylene) copolymer.

* * * * *

UNITED STATES PATENT AND TRADEMARK OFFICE
CERTIFICATE OF CORRECTION

PATENT NO. : 8,371,128 B2
APPLICATION NO. : 12/620477
DATED : February 12, 2013
INVENTOR(S) : Kruglick Page 1 of 3

It is certified that error appears in the above-identified patent and that said Letters Patent is hereby corrected as shown below:

In the Drawings:

In Fig. 9, Sheet 9 of 10, delete "uP / uC / DSP" and insert -- $\mu$P / $\mu$C / DSP --, therefor. (As attached)

In Fig. 9, Sheet 9 of 10, in Box "915", in Line 1, delete "CONTROLER" and
insert -- CONTROLLER --, therefor. (As attached)

In the Specifications:

In Column 3, Line 1, delete "cholorfluoroethylene" and
insert -- chlorofluoroethylene --, therefor.

In Column 4, Lines 7-8, delete "field control logic 136" and
insert -- field control logic 132 --, therefore at each occurrence throughout the specification.

In Column 8, Line 29, delete "one more" and insert -- one or more --, therefor.

In Column 9, Line 3, delete "(HDD)," and insert -- (HDDs), --, therefor.

In Column 9, Line 5, delete "(SSD)," and insert -- (SSDs), --, therefor.

In Column 9, Line 15, delete "(DVD)" and insert -- (DVDs) --, therefor.

In Column 9, Line 30, delete "NV" and insert -- A/V --, therefor.

Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,371,128 B2

In the Claims:

In Column 12, Line 35, in Claim 8, delete "an event." and insert -- of an event. --, therefor.

In Column 14, Line 2, in Claim 17, delete "an event." and insert -- of an event. --, therefor.

In Column 14, Line 7, in Claim 19, delete "element" and insert -- element; --, therefor.